(12) United States Patent
Yang et al.

(10) Patent No.: US 11,773,275 B2
(45) Date of Patent: Oct. 3, 2023

(54) STABILIZED SPARSE METAL CONDUCTIVE FILMS AND SOLUTIONS FOR DELIVERY OF STABILIZING COMPOUNDS

(71) Applicant: C3Nano Inc., Hayward, CA (US)

(72) Inventors: Xiqiang Yang, Hayward, CA (US); Yongxing Hu, Fremont, CA (US); Ajay Virkar, San Mateo, CA (US); Arthur Yung-Chi Cheng, Fremont, CA (US); Faraz Azadi Manzour, Berkeley, CA (US); Ying-Syi Li, Fremont, CA (US)

(73) Assignee: C3 Nano, Inc., Hayward, CA (US)

( * ) Notice: Subject to any disclaimer, the term of this patent is extended or adjusted under 35 U.S.C. 154(b) by 1335 days.

(21) Appl. No.: 15/730,053

(22) Filed: Oct. 11, 2017

(65) Prior Publication Data

US 2018/0105704 A1  Apr. 19, 2018

Related U.S. Application Data

(60) Provisional application No. 62/427,348, filed on Nov. 29, 2016, provisional application No. 62/408,371, filed on Oct. 14, 2016.

(51) Int. Cl.
*H01B 5/14* (2006.01)
*H01B 1/22* (2006.01)
(Continued)

(52) U.S. Cl.
CPC ............... *C09D 5/24* (2013.01); *C09D 5/002* (2013.01); *C09D 7/61* (2018.01); *C09D 7/70* (2018.01);
(Continued)

(58) Field of Classification Search
CPC ... C09D 5/24; C09D 7/61; C09D 7/70; C09D 11/52; H01B 1/22; H01B 5/14; H01B 13/0036
See application file for complete search history.

(56) References Cited

U.S. PATENT DOCUMENTS 2,453,087 A   11/1948 Dersch et al.
3,008,858 A   11/1961 Blake et al.
(Continued)

FOREIGN PATENT DOCUMENTS

CN    1913961 A    2/2007
CN    101544081 A   9/2009
(Continued)

OTHER PUBLICATIONS

Britannica Academic, Encyclopedia Britannica corrosion definition, Apr. 15, 2016 (one page) downloaded on Jun. 3, 2021 from https://academic.eb.com/levels/collegiate/article/corrosion/472131 (Year: 2016).*

(Continued)

*Primary Examiner* — Monique R Jackson
(74) *Attorney, Agent, or Firm* — Christensen, Fonder, Dardi; Elizabeth A. Gallo; Peter S. Dardi (57) ABSTRACT

Metal salt based stabilizers are described that are effective to improve stability of sparse metal conductive films formed with metal nanowires, especially silver nanowires. Specifically, vanadium (+5) compositions can be effectively placed in coatings to provide desirable stabilization under accelerated wear testing conditions. Sparse metal conductive films can comprise fused metal nanostructured networks. Cobalt (+2) compounds can be incorporated as stabilization agents within nanowire inks to provide a high degree of stabilization without significantly interfering with the fusing process.

2 Claims, 5 Drawing Sheets

(51) Int. Cl.
   C09D 7/61 (2018.01)
   C09D 5/24 (2006.01)
   H01B 13/00 (2006.01)
   C09D 11/52 (2014.01)
   C09D 7/40 (2018.01)
   H01L 31/18 (2006.01)
   C09D 5/00 (2006.01)

(52) U.S. Cl.
   CPC ............. *C09D 11/52* (2013.01); *H01B 1/22* (2013.01); *H01B 5/14* (2013.01); *H01B 13/0036* (2013.01); *H01L 31/1884* (2013.01); *Y02E 10/50* (2013.01)

(56) References Cited

U.S. PATENT DOCUMENTS

| | | | |
|---|---|---|---|
| 3,088,849 | A | 5/1963 | Friedlander |
| 3,772,354 | A | 11/1973 | Fredricks et al. |
| 3,824,192 | A | 7/1974 | DiBattista et al. |
| 4,012,399 | A | 3/1977 | Hechenbleikner et al. |
| 4,087,406 | A | 5/1978 | Ramey et al. |
| 4,202,816 | A | 5/1980 | Moser et al. |
| 4,296,151 | A | 10/1981 | Boultinghouse |
| 4,348,462 | A | 9/1982 | Chung |
| 4,623,676 | A | 11/1986 | Kistner |
| 4,720,356 | A | 1/1988 | Chu |
| 4,734,449 | A | 3/1988 | Gugumus |
| 4,994,511 | A | 2/1991 | Kluttz |
| 5,258,225 | A | 11/1993 | Katsamberis |
| 5,376,428 | A | 12/1994 | Palazzotto et al. |
| 5,422,233 | A | 6/1995 | Eckert et al. |
| 5,470,985 | A | 11/1995 | Ninomiya et al. |
| 5,565,501 | A | 10/1996 | Hosokawa et al. |
| 5,610,211 | A | 3/1997 | Borzatta et al. |
| 5,667,953 | A | 9/1997 | Bertoldi et al. |
| 6,139,610 | A | 10/2000 | Sinko |
| 6,254,829 | B1 | 7/2001 | Hartmann et al. |
| 6,353,042 | B1 | 3/2002 | Hanoka et al. |
| 6,629,833 | B1 | 10/2003 | Ohya et al. |
| 7,393,395 | B2 | 7/2008 | Aiba et al. |
| 7,504,510 | B2 | 3/2009 | Meier et al. |
| 8,026,042 | B2 | 9/2011 | Kim et al. |
| 8,031,180 | B2 | 10/2011 | Miyamoto et al. |
| 8,049,333 | B2 | 11/2011 | Alden et al. |
| 8,171,628 | B2 | 5/2012 | Yamazaki |
| 8,183,195 | B2 | 5/2012 | Westwood |
| 8,748,749 | B2 | 6/2014 | Srinivas et al. |
| 8,883,045 | B2 | 11/2014 | Hosoya et al. |
| 9,061,268 | B2 | 6/2015 | Soultanidis et al. |
| 9,150,746 | B1 | 10/2015 | Li et al. |
| 9,183,968 | B1 | 11/2015 | Li et al. |
| 2004/0033369 | A1 | 2/2004 | Fleming et al. |
| 2004/0076844 | A1 | 4/2004 | Tojo et al. |
| 2005/0062019 | A1 | 3/2005 | Yukinobu |
| 2008/0126705 | A1 | 9/2008 | Hayes et al. |
| 2008/0286447 | A1 | 11/2008 | Alden et al. |
| 2009/0022967 | A1 | 1/2009 | Inenaga |
| 2009/0117369 | A1 | 5/2009 | Jaworowski et al. |
| 2009/0129004 | A1 | 5/2009 | Gruner |
| 2009/0133922 | A1 | 5/2009 | Okazaki et al. |
| 2011/0259464 | A1 | 10/2011 | Lacroix et al. |
| 2012/0012164 | A1 | 1/2012 | Sugiura et al. |
| 2012/0073947 | A1 | 3/2012 | Sakata et al. |
| 2013/0087363 | A1 | 4/2013 | Oh et al. |
| 2013/0341074 | A1 | 12/2013 | Virkar et al. |
| 2013/0341571 | A1 | 12/2013 | Iijima et al. |
| 2013/0342221 | A1 | 12/2013 | Virkar et al. |
| 2014/0072826 | A1 | 3/2014 | Philip, Jr. et al. |
| 2014/0088383 | A1 | 3/2014 | Colvin, Jr. et al. |
| 2014/0170407 | A1 | 6/2014 | Zou et al. |
| 2014/0170427 | A1 | 6/2014 | Philip, Jr. et al. |
| 2014/0199555 | A1 | 7/2014 | Philip, Jr. et al. |
| 2014/0202738 | A1 | 7/2014 | Allemand et al. |
| 2014/0205845 | A1 | 7/2014 | Philip, Jr. et al. |
| 2014/0234618 | A1 | 8/2014 | Allemand et al. |
| 2014/0234661 | A1 | 8/2014 | Allemand et al. |
| 2014/0238833 | A1 | 8/2014 | Virkar et al. |
| 2014/0251655 | A1 | 9/2014 | Philip, Jr. et al. |
| 2014/0262454 | A1 | 9/2014 | Zou et al. |
| 2014/0377704 | A1 | 12/2014 | Mukai et al. |
| 2015/0090573 | A1 | 4/2015 | Mansky et al. |
| 2015/0144380 | A1 | 5/2015 | Yang et al. |
| 2015/0270024 | A1 | 9/2015 | Allemand |
| 2016/0032127 | A1 | 2/2016 | Li et al. |
| 2016/0108256 | A1 | 4/2016 | Yang et al. |
| 2016/0122562 | A1 | 5/2016 | Yang et al. |
| 2016/0293288 | A1 | 10/2016 | Hu et al. |
| 2016/0369104 | A1 | 12/2016 | Gu et al. |

FOREIGN PATENT DOCUMENTS

| | | |
|---|---|---|
| CN | 102115880 A | 7/2011 |
| CN | 102250506 A | 11/2011 |
| CN | 104200872 A | 12/2014 |
| JP | 2004-053685 A | 2/2004 |
| JP | 2009255549 A * | 11/2009 |
| JP | 2012-079257 A | 4/2012 |
| JP | 5538153 B2 | 7/2014 |
| JP | 2014-167659 A | 9/2014 |
| TW | 201410811 A | 3/2014 |
| WO | 2009-036790 A1 | 3/2009 |
| WO | 2013-084873 A1 | 6/2013 |
| WO | 2014-093005 A1 | 6/2014 |
| WO | 2015-143383 A1 | 9/2015 |
| WO | 2016-160759 A1 | 10/2016 |

OTHER PUBLICATIONS

Atlas Material Testing Technology LLC, "Ci4000 Weather-Ometer: Setting the Standard for Xenon Weathering," © 2014.

Sangermano et al., "UV-Cured Interpenetrating Acrylic-Epoxy Polymer Networks: Preparation and Characterization," Macromolecular Materials and Engineering, (2008), 293(6):515-520. Abstract only.

Zhu et al., "Fused Silver Nanowires with Metal Oxide Nanoparticles and Organic Polymers for Highly Transparent Conductors," ACS Nano, vol. 5, No. 12, (2011); pp. 9877-9882.

Walton, "New Pre-Catalysts for Olefin Polymerisation and Ring-Opening Polymerisation of Lactides/Lactones", University of East Anglie Department of Chemistry, Ph.D Thesis, pp. 1-154, 2014.

International Search Report and Written Opinion from the corresponding PCT International Application No. PCT/US2017/056134 dated Jan. 8, 2018.

Search Report from co-pending European Patent Application No. 17861111.7 for PCT/US2017/056134 dated Apr. 29, 2020.

Office Action from co-pending Chinese Patent Application No. 2017800634456 dated May 18, 2020.

* cited by examiner

STABILIZED SPARSE METAL CONDUCTIVE FILMS AND SOLUTIONS FOR DELIVERY OF STABILIZING COMPOUNDS

CROSS REFERENCE TO RELATED APPLICATIONS

This application claims priority to U.S. provisional patent applications 62/408,371 to Yang et al., filed on Oct. 14, 2016, entitled "Stabilized Sparse Metal Conductive Films and Solutions for Delivery of Stabilizing Compounds," and 62/427,348 to Yang et al., filed on Nov. 29, 2016, entitled "Stabilized Sparse Metal Conductive Films and Solutions for Delivery of Stabilizing Compounds," both of which are incorporated herein by reference.

FIELD OF THE INVENTION

The invention is directed to stabilized transparent electrically conductive films that can resist degradation under accelerated wear testing conditions, in which the conductive films can comprise metallic nanostructured layers, which have, for example, metal nanowires or fused metal nanostructured networks. The invention further relates to inks for the formation of sparse metal conductive layers with stabilization agents as well as hardcoat precursor solutions with stabilization agents.

BACKGROUND OF THE INVENTION

Functional films can provide important roles in a range of contexts. For example, electrically conductive films can be important for the dissipation of static electricity when static can be undesirable or dangerous. Optical films can be used to provide various functions, such as polarization, anti-reflection, phase shifting, brightness enhancement or other functions. High quality displays can comprise one or more optical coatings.

Transparent conductors can be used for several optoelectronic applications including, for example, touch-screens, liquid crystal displays (LCD), flat panel display, organic light emitting diode (OLED), solar cells and smart windows. Historically, indium tin oxide (ITO) has been the material of choice due to its relatively high transparency at high conductivities. There are however several shortcomings with ITO. For example, ITO is a brittle ceramic which needs to be deposited using sputtering, a fabrication process that involves high temperatures and vacuum and therefore can be relatively slow. Additionally, ITO is known to crack easily on flexible substrates.

SUMMARY OF THE INVENTION

In a first aspect, the invention pertains to a transparent conductive structure comprising a substrate, a sparse metal electrically conductive layer supported by the substrate, and a coating layer adjacent the sparse metal conductive layer. The coating layer can comprise a polymer matrix and a vanadium (+5) stabilization composition.

In a further aspect, the invention pertains to a stabilization hardcoat precursor solution comprising crosslinkable polymer precursors, solvent and from about 0.1 wt % to about 9 wt % stabilization composition relative to the solid weight, the stabilization composition comprising vanadium (+5) ions.

In another aspect, the invention pertains to a dispersion comprising solvent, from about 0.01 wt % to about 1 wt % silver nanowires, a silver metal ion source, cobalt+2 complexes, and a reducing agent, wherein the cobalt+2 complexes comprise $Co^{+2}$ ions and ligands at a molar equivalent ratio ligands to cobalt ions from about 0.01 to about 2.6. In an additional aspect, the invention pertains to a transparent conductive structure comprising a substrate, a transparent conductive layer supported by the substrate and comprising a fused metal nanostructured network, a polymer binder, and a stabilization compound comprising cobalt (+2), wherein the fused metal nanostructured layer is formed from the drying of a wet coating of this dispersion.

DETAILED DESCRIPTION OF THE INVENTION

Desirable stabilization agents can provide long term stable performance for sparse metal conductive layers incorporated into transparent conductive films. The sparse metal conductive layers can comprise an open structure of nanoscale metal elements that are vulnerable to degradation pathways. Light stabilization agents are described that can stabilize the sparse metal conductive layers under environmental assaults, such as intense light, heat and environmental chemicals, and the stability can be tested under accelerated wear conditions. In particular, specific metal salts have been found to be effective as stabilization agents, and these metal salts can comprise V(+5). In some embodiments, the sparse metal conductive layers can comprise fused metal nanostructured networks, which are a unitary conductive structure. It has been found that Co(+2) based complexes with appropriate ligands are effective to stabilize the fused structures without interfering with the fusing process. In some embodiments, the stabilization compositions can be placed in a polymer overcoat composition to effectively stabilize the sparse metal conductive layer. The stabilized structure can be assembled into a layered stack that can form a component of a touch sensor or the like.

Transparent electrically conductive elements, e.g., films, of particular interest herein comprise a sparse metal conductive layer. The conductive layers are generally sparse to provide desired amount of optical transparency, so the coverage of the metal generally has significant gaps over the layer of the conductive element. For example, transparent electrically conductive films can comprise metal nanowires deposited along a layer where sufficient contact can be provided for electron percolation to provide suitable conduction pathways. In other embodiments, the transparent electrically conductive film can comprise a fused metal nanostructured network, which has been found to exhibit desirable electrical and optical properties. Conductivity referenced herein refers to electrical conductivity unless specifically indicated otherwise.

Sparse metal conductive layers, regardless of the specific structures, are vulnerable to environmental assaults. The sparse feature implies that the structures are somewhat fragile. Assuming that the elements are appropriately protected from mechanical damage, the sparse metal conductive layers can be vulnerable to damage from various other sources, such as atmospheric oxygen, water vapor, other corrosive chemicals in the local environment, light, heat, combinations thereof, and the like. For commercial applications, degradation of properties of the transparent conductive structures should be within desired specifications, which in other words indicates that the transparent conductive layers provide suitable lifetimes for devices incorporating them. To achieve these objectives, stabilization approaches have been found, and some desirable stabilization compositions are described herein. Accelerated wear studies are described to test the transparent conductive films.

It has been found that additional stabilization of the sparse metal conductive layer can be achieved through the appropriate design of the overall structure. In particular, a stabilization composition can effectively be placed within the sparse metal conductive layer or in a layer adjacent the sparse metal conductive element, which can be an overcoat layer or an undercoat layer. To simplify the discussion, a reference to a coating layer refers to an overcoat layer, an undercoat layer or both unless explicitly stated otherwise. It has been found that some compositions are particularly effective in different layers. In particular, vanadium (+5) compositions have been found to be particularly effective in a coating layer while cobalt (+2) complexes have been found to be particularly effective in the sparse metal conductive layer.

The stabilization of silver nanowire conductive layers is also described, for example, in published U.S. patent applications 2014/0234661 to Allemand et al. (the '661 application), entitled "Methods to Incorporate Silver Nanowire-Based Transparent Conductors in Electronic Devices," 2014/0170407 to Zou et al. (the '407 application), entitled "Anticorrosion Agents for Transparent Conductive Film," and 2014/0205845 to Philip, Jr. et al. (the '845 application), entitled "Stabilization Agents for Transparent Conductive Films," all three of which are incorporated herein by reference. These applications focused mainly on organic stabilization agents. The '661 application notes that "Metallic Photo-Desensitizers," such as rhodium salts, zinc salts, or cadmium salts, can be used as stabilizers.

Metal salts as stabilizers are described further in published U.S. patent application 2015/0270024A1 (hereinafter the '024 application), to Allemand entitled "Light Stability of Nanowire-Based Transparent Conductors," incorporated herein by reference. In particular, the '024 application finds particular stabilization with iron (+2) salts in the metal nanowire layers or in an overcoat layer. Several metal salts were soaked into the metal nanowire layer. For example, cobalt acetylacetonate was soaked into a conductive film to improve stability. The results for cobalt+2 soaked into the conductive layer in FIG. 13 of the '024 application were mixed in that resistance at the tape edge increased sharply after less than 500 hours of testing. The results shown herein demonstrate that for Co+2 ion complexes introduced into an ink to form a fused metal conductive network provides substantial long term stability if suitable ligands are introduced in suitable concentrations. Contrary to the results in the '024 application, the introduction of uncomplexed Co+2 ions into a fused metal nanostructured network results in destabilization of the conductive structure.

Applicant previously discovered useful organic stabilization agents, as described in published U.S. patent application 2016/0122562A1 to Yang et al. (hereinafter the '562 application), entitled "Stable Transparent Conductive Elements Based on Sparse Metal Conductive Layers," incorporated herein by reference. The '562 application found various useful organic stabilization agents that could provide significant stabilization for the sparse metal conductive layers. In particular, relatively low concentrations of a stabilization compound in a coating layer optionally combined with an appropriately selected optically clear adhesive was found to greatly improve the stability of the sparse nanostructured metal element. An optically clear adhesive, e.g., as a component of the film, can be used to provide for attaching the transparent conductive film to a device, and the selection of the optically clear adhesive has been found to significantly facilitate obtaining a desired degree of stabilization. In particular, optically clear adhesives can comprise a double sided adhesive layers on a carrier layer. The carrier layer can be a polyester, such as PET or a commercial barrier layer material, which may provide a desirable moisture and gas barrier to protect the sparse metal conductive layers, although Applicant does not want to be limited by a theory of operation of particular optically clear adhesives. The metal salt stabilization agents found herein are found to be effective with a broader range of optically clear adhesives.

In general, various sparse metal conductive layers can be formed from metal nanowires. Films formed with metal nanowires that are processed to flatten the nanowires at junctions to improve conductivity is described in U.S. Pat. No. 8,049,333 to Alden et al., entitled "Transparent Conductors Comprising Metal Nanowires," incorporated herein by references. Structures comprising surface embedded metal nanowires to increase metal conductivity are described in U.S. Pat. No. 8,748,749 to Srinivas et al., entitled "Patterned Transparent Conductors and Related Manufacturing Methods," incorporated herein by reference. However, desirable properties have been found for fused metal nanostructured networks with respect to high electrical conductivity and desirable optical properties with respect to transparency and low haze. Fusing of adjacent metal nanowires can be performed based on chemical processes under commercially appropriate processing conditions.

Metal nanowires can be formed from a range of metals, and metal nanowires are available commercially. While metal nanowires are inherently electrically conducting, the vast majority of resistance in the metal nanowires based films is believed to be at the junctions between nanowires. Depending on processing conditions and nanowire properties, the sheet resistance of a relatively transparent nanowire film, as deposited, can be very large, such as in the giga-ohm/sq range or even higher. Various approaches have been proposed to reduce the electrical resistance of the nanowire films without destroying the optical transparency. Low temperature chemical fusing to form a metal nanostructured network has been found to be very effective at lowering the electrical resistance while maintaining the optical transparency.

In particular, a significant advance with respect to achieving electrically conductive films based on metal nanowires has been the discovery of well controllable processes to form a fused metal network where adjacent sections of the metal nanowires fuse. Fusing of metal nanowires with various fusing sources is described further in published U.S. patent applications 2013/0341074 to Virkar et al., entitled "Metal Nanowire Networks and Transparent Conductive Material," and 2013/0342221 to Virkar et al. (the '221 application), entitled "Metal Nanostructured Networks and Transparent Conductive Material," 2014/0238833 to Virkar et al. (the '833 application), entitled "Fused Metal Nanostructured Networks, Fusing Solutions With Reducing Agents and Methods for Forming Metal Networks," published U.S. patent application 2015/0144380 to Yang et al. (the '669 application), entitled "Transparent Conductive Coatings Based on Metal Nanowires, Solution Processing Thereof, and Patterning Approaches," and U.S. Pat. No. 9,183,968 to Li et al., entitled "Metal Nanowire Inks for the Formation of Transparent Conductive Films With Fused Networks," all of which are incorporated herein by reference.

For incorporation into a product, the transparent conductive films generally comprise several components or layers that contribute to the processability and/or the mechanical properties of the structure without detrimentally altering the optical properties. In some embodiments, the stabilization compounds can be added in low amounts and are not observed to alter the optical properties of the structure by more than 10% with respect to haze and/or absorption, i.e., decrease in transmission, if at all. The sparse metal conductive layers can be designed to have desirable optical properties when incorporated into the transparent conductive films. The sparse metal conductive layer may or may not further comprise a polymer binder. Unless otherwise indicated, references to thicknesses refer to average thicknesses over the referenced layer or film, and adjacent layers may intertwine at their boundaries depending on the particular materials. In some embodiments, the total film structure can have a total transmission of visible light of at least about 85%, a haze of no more than about 2 percent and a sheet resistance after formation of no more than about 250 ohm/sq, and in further embodiments optical transmission can be significantly greater, haze significantly lower and sheet resistance significantly lower.

In the context of the current work, instability seems associated with a restructuring of the metal in the conductive element that results in a lowering of electrical conductivity, which can be measured as an increase in sheet resistance. Thus, the stability can be evaluated in terms of the amount of an increase in sheet resistance over time. A test apparatus may provide an intense light source, heat and/or humidity in a controlled environment.

It has been found that particular instabilities occur at portions of a film that are covered, which can correspond to an edge of a transparent conductive film of an actual device where electrical connections to the transparent conductive film are made and hidden from view. The covered portions of the transparent conductive film may be heated when the covered film is subjected to lighted conditions, and the heat is believed to contribute to instabilities that are addressed herein. Generally, testing can be performed using partially covered transparent conductive films to apply more stringent testing conditions.

Transparent, electrically conductive films find important applications, for example in solar cells and touch screens. Transparent conductive films formed from metal nanowire components offer the promise of lower cost processing and more adaptable physical properties relative to traditional materials. In a multilayered film with various structural polymer layer(s), the resulting film structure has been found to be robust with respect to processing while maintaining desirable electrical conductivity, and the incorporation of desirable components as described herein can additionally provide stabilization without degrading the functional properties of the film so that devices incorporating the films can have suitable lifetimes in normal use.

The stabilization compositions described herein have been found to result in desirable degrees of stabilization under relatively stringent conditions in accelerated wear tests. The stabilization compositions have been found to result in less dependence of the stabilization on different optically clear adhesives in the structure. The stabilization can be achieved either through the use of vanadium (+5) compositions in a coating layer or cobalt (+2) complexes in a layer with a fused metal nanostructured network. Under the relatively stringent conditions of accelerates wear test described below, the transparent conductive elements can exhibit an increase in sheet resistance of no more than about 30% in 600 hours and an increase of no more than about 75% in 2000 hours. The stabilization compositions are suitable for use in commercial devices.

Stabilization Compositions

For incorporation into an overcoat layer, vanadium compounds with a +5 valance have been found to yield desirable stabilization under extended wear testing. Suitable compounds include compounds with the vanadium as a cation as well as compounds with vanadium as a part of a multi-atom anion, such as metavanadate ($VO_3^-$) or orthovanadate ($VO_4^{-3}$). Corresponding salt compounds with pentavalent vanadium anions in an oxometalate include, for example, ammonium metavanadate ($NH_4VO_3$), potassium metavanadate ($KVO_3$), tetrabutylammonium vanadate ($NBu_4VO_3$), sodium metavanadate ($NaVO_3$), sodium orthovanadate ($Na_3VO_4$), other metal salts and the like, or mixtures thereof. Suitable penta-valent vanadium cation compounds include, for example, vanadium oxytrialkoxides ($VO(OR)_3$, R is an alkyl group, for example, n-propyl, isopropyl, ethyl, n-butyl, or the like, or combinations thereof), vanadium oxytrihalides ($VOX_3$ where X is Cl, F, Br or combinations thereof), vanadium complexes, such as $VO_2Z_1Z_2$, where $Z_1$ and $Z_2$ are independently ligands such as those described further below with respect to Co+2 complexes, or combinations thereof. Examples are presented below based on vanadium oxytripropoxide and sodium metavanadate. In coatings, the penta-valent vanadium can be present, for example, from about 0.01 wt % to about 9 wt %, in further embodiments, from about 0.02 wt % to about 8 wt % and in additional embodiments from about 0.05 wt % to about 7.5 wt %. In a coating solution, the solution generally comprises some solvent along with the solids that primarily comprise a curable polymer. The coating solutions are described in more detail below. Generally, the corresponding coating solution can have the penta-valent vanadium compounds in concentrations from about 0.0001 wt % to about 1 wt %. A person of ordinary skill in the art will recognize that additional ranges of concentrations within the explicit ranges above are contemplated and are within the present disclosure.

For use directly in a transparent conductive film, especially with fused metal nanostructured networks, cobalt with a +2 valence has been found to be effective for stabilization without interfering with the fusing process. Suitable cobalt compounds include, for example, $Co(NO_3)_2$ with various complexing ligands, such as nitrite ($NO_2$), diethyl amine, ethylene diamine (en), nitrilotriacetic acid, iminobis(methylene phosphonic acid), aminotris(methylene phosphonic acid), ethylene diamine tetraacetic acid (EDTA), 1,3-propylenediaminetetraacetic acid (1,3-PDTA), triethylene tetramine, tri(2-aminoethyl) amine, 1,10-phenanthroline, 1,10-phenanthroline-5,6-dione, 2,2'-bipyridine, 2,2'-bipyridine-4,4'-dicarboxylic acid, dimethylglyoxime, salicylaldoxime, diethylenetriaminepentaacetic acid, 1,2-cyclohexanediaminotetraacetic acid, iminodiacetic acid, methyliminodiacetic acid, N-(2-acetamide) iminoacetic acid, N-(2-carboxyethyl) iminodiacetic acid, N-(2-carboxymethyl)imino dipropionic acid, picolinic acid, dipicolinic acid, histidine, combinations thereof. Cobalt ions have been previously suggested as a suitable ion source for fusing metal at nanowire junctions in the '833 application cited above. As shown in the Examples below, Co+2 actually destabilizes the transparent conductive film unless it is complexed with a ligand. With respect to the use of cobalt+2 stabilization compounds in the layer with the fused metal nanostructured network, the stabilization compounds would be added with a silver salt or other salt of a cation that would be much more readily reduced so that the cobalt+2 cations remain in the material following the fusing process. On the other hand, a stoichiometric amount of ligands for Co+2 has been found to interfere with the fusing process to form a fused nanostructured network. In the layer with the fused metal nanostructured network, the concentration of the cobalt+2 stabilization compounds can be from about 0.1 wt % to about 10 wt %, in further embodiments, from about 0.02 wt % to about 8 wt % and in additional embodiments from about 0.025 wt % to about 7.5 wt %. For the cobalt compositions to be effective without interfering with the fusing process, complexing ligands can be present in amounts from about 0.1 to about 2.6 ligand binding equivalents per mole cobalt, in further embodiments from about 0.5 to about 2.5 and in other embodiment from about 0.75 to about 2.4 ligand binding equivalents per mole cobalt With respect to equivalents, this terminology is intended to indicate that ligands that are multidentate have correspondingly molar ratios for the above ranges divided by their coordination number. With respect to the ink used to deposit the metal nanowires, the solution can comprise the cobalt+2 compounds in concentrations from about 0.0001 wt % to about 1 wt %, although further details of the nanowire inks are presented below. A person of ordinary skill in the art will recognize that additional ranges of concentrations within the explicit ranges above are contemplated and are within the present disclosure.

While a range of solutions for forming coatings can be used, in some embodiments, the solutions are based on organic solvents along with crosslinkable hardcoating precursors. Generally, the coating solution comprises at least about 7 wt % solvent, and in further embodiments from about 10 wt % to about 70 wt % solvent, with the remainder being non-volatile solids. In general, the solvents can comprise water, organic solvents or suitable mixtures thereof. Suitable solvents generally include, for example, water, alcohols, ketones, esters, ethers, such as glycol ethers, aromatic compounds, alkanes, and the like and mixtures thereof. Specific solvents include, for example, water, ethanol, isopropyl alcohol, isobutyl alcohol, tertiary butyl alcohol, methyl ethyl ketone, methyl isobutyl ketone, cyclic ketones such as cylcopentanone and cyclohexanone, diacetone alcohol, glycol ethers, toluene, hexane, ethyl acetate, butyl acetate, ethyl lactate, propylene carbonate, dimethyl carbonate, PGMEA (2-methoxy-1-methylethylacetate), N,N-dimethylformamide, N,N-dimethylacetamide, acetonitrile, formic acid, or mixtures thereof. In some embodiments, nonaqueous solvents can be desirable. The solvent selection generally is based to some degree on the hardcoat polymer coating composition.

In general, the polymer for the coating, generally a crosslinkable polymer, can be supplied as a commercial coating composition or formulated with selected polymer compositions. Suitable classes of radiation curable polymers and/or heat curable polymers include, for example, polysiloxanes, polysilsesquioxanes, polyurethanes, acrylic resins, acrylic copolymers, cellulose ethers and esters, nitrocellulose, other water insoluble structural polysaccharides, polyethers, polyesters, polystyrene, polyimide, fluoropolymer, styrene-acrylate copolymers, styrene-butadiene copolymers, acrylonitrile butadiene styrene copolymers, polysulfides, epoxy containing polymers, copolymers thereof, and mixtures thereof. Suitable commercial coating compositions include, for example, coating solutions from Dexerials Corporation (Japan), POSS® Coatings from Hybrid Plastics, Inc. (Mississippi, USA), silica filled siloxane coatings from California Hardcoating Company (California, USA), CrystalCoat UV-curable coatings from SDC Technologies, Inc. (California, USA). The polymer concentrations and correspondingly the concentrations of other non-volatile agents can be selected to achieve desired rheology of the coating solution, such as an appropriate viscosity for the selected coating process. Solvent can be added or removed to adjust total solid concentrations. Relative amounts of solids can be selected to adjust the composition of the finished coating composition, and the total amounts of solids can be adjusted to achieve a desired thickness of the dried coating. Generally, the coating solution can have a polymer concentration from about 0.025 wt % to about 70 wt %, in further embodiments from about 0.05 wt % to about 50 wt % and in additional embodiments from about 0.075 wt % to about 40 wt %. A person of ordinary skill in the art will recognize that additional ranges of polymer concentrations within the specific ranges above are contemplated and are within the present disclosure. Another class of hardcoating compositions of interest are described in published U.S. patent application 2016/0369104 to Gu et al., entitled "Transparent Polymer Hardcoats and Corresponding Transparent Films," incorporated herein by reference. The stabilization salt can be blended using appropriate mixing equipment into the polymer coating composition.

Transparent Conductive Films

The transparent electrically conductive structures or films generally comprise a sparse metal conductive layer that provides the electrical conductivity without significantly adversely altering the optical properties and various additional layers that provide mechanical support as well as protection of the conductive element. The sparse metal conductive layer is extremely thin and correspondingly susceptible to damage by mechanical and other abuses. With respect to sensitivities to environmental damage, it has been found that an undercoat and/or overcoat can comprise a stabilization composition that can provide desirable protection. While the focus herein is on environmental assaults from environmental chemicals, humid air, heat and light, polymer sheets used to protect the conductive layers from these environmental assaults can also provide protection from contact and the like.

Thus, the sparse metal conductive layer can be formed on a substrate that can have one or more layers in the structure of the substrate. The substrate generally can be identified as a self-supporting film or sheet structure. A thin solution processed layer, referred to as an undercoat, can be optionally placed along the top surface of the substrate film and immediately under the sparse metal conductive layer. Also, the sparse metal conductive can be coated with additional layers that provide some protection on the side of the sparse metal conductive layer opposite the substrate. In general, the electrically conductive structure can be placed in either orientation in the final product, i.e., with the substrate facing outward or with the substrate against the surface of the product supporting the electrically conductive structure.

Figure 1:
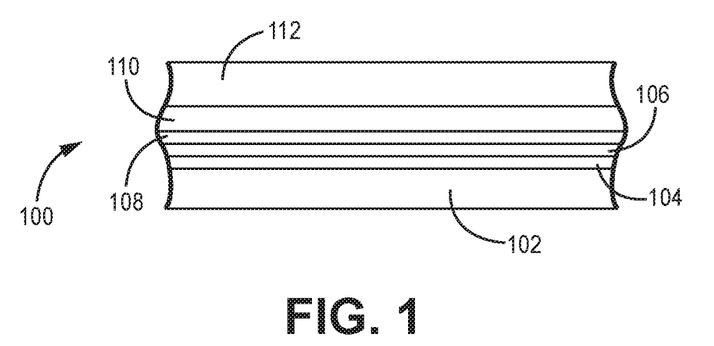
FIG. 1 is a fragmentary side view of a film with a sparse metal conductive layer and various additional transparent layers on either side of the sparse metal conductive layer.

Referring to FIG. 1, representative transparent conductive film 100 comprises a substrate 102, undercoat layer 104, sparse metal conductive layer 106, overcoat layer 108, optically clear adhesive layer 110 and protective surface layer 112, although not all embodiments include all layers. A transparent conductive film generally comprises a sparse metal conductive layer and at least one layer on each side of the sparse metal conductive layer. The total thickness of the transparent conductive film can generally have an average thickness from 10 microns to about 3 millimeters (mm), in further embodiments from about 15 microns to about 2.5 mm and in other embodiments from about 25 microns to about 1.5 mm. A person of ordinary skill in the art will recognize that additional ranges of thicknesses within the explicit ranges above are contemplated and are within the present disclosure. In some embodiments, the length and width of the film as produced can be selected to be appropriate for a specific application so that the film can be directly introduced for further processing into a product. In additional or alternative embodiments, a width of the film can be selected for a specific application, while the length of the film can be long with the expectation that the film can be cut to a desired length for use. For example, the film can be in long sheets or a roll. Similarly, in some embodiments, the film can be on a roll or in another large standard format and elements of the film can be cut according to a desired length and width for use.

Substrate 102 generally comprises a durable support layer formed from an appropriate polymer or polymers. In some embodiments, the substrate can have an average thickness from about 20 microns to about 1.5 mm, in further embodiments from about 35 microns to about 1.25 mm and in additional embodiments from about 50 microns to about 1 mm. A person of ordinary skill in the art will recognize that additional ranges of thicknesses of the substrate within the explicit ranges above are contemplated and are within the present disclosure. Suitable optically clear polymers with very good transparency, low haze and good protective abilities can be used for the substrate. Suitable polymers include, for example, polyethylene terephthalate (PET), polyethylene naphthalate (PEN), polyacrylate, poly(methyl methacrylate), polyolefin, polyvinyl chloride, fluoropolymers, polyamide, polyimide, polysulfone, polysiloxane, polyetheretherketone, polynorbornene, polyester, polystyrene, polyurethane, polyvinyl alcohol, polyvinyl acetate, acrylonitrile-butadiene-styrene copolymer, cyclic olefin polymer, cyclic olefin copolymer, polycarbonate, copolymers thereof or blend thereof or the like. Suitable commercial polycarbonate substrates include, for example, MAKROFOL SR243 1-1 CG, commercially available from Bayer Material Science; TAP® Plastic, commercially available from TAP Plastics; and LEXAN™ 8010 CDE, commercially available from SABIC Innovative Plastics. Protective surface layer 112 can independently have a thickness and composition covering the same thickness ranges and composition ranges as the substrate as described in this paragraph above.

Optional undercoat 104 and/or optional overcoat 108, independently selectable for inclusion, can be placed respectively under or over sparse metal conductive layer 106. Optional coatings 104, 108 can comprise a curable polymer, e.g., heat curable or radiation curable polymers. Suitable polymers for optional coatings 104, 108 are described below as binders for inclusion in the metal nanowire inks, and the list of polymers, corresponding cross linking agents and additives apply equally to optional coatings 104, 108 without repeating the discussion explicitly here. Optional coatings 104, 108 can have an average thickness from about 25 nm to about 2 microns, in further embodiments from about 40 nm to about 1.5 microns and in additional embodiments from about 50 nm to about 1 micron. A person of ordinary skill in the art will recognize that additional ranges of overcoat thickness within the explicit ranges above are contemplated and are within the present disclosure.

Optional optically clear adhesive layer 110 can have an average thickness from about 10 microns to about 300 microns, in further embodiments from about 15 microns to about 250 microns and in other embodiments from about 20 microns to about 200 microns. A person of ordinary skill in the art will recognize that additional ranges of thicknesses of optically clear adhesive layers within the explicit ranges above are contemplated and are within the present disclosure. Suitable optically clear adhesives can be contact adhesives. Optically clear adhesives include, for example, coatable compositions and adhesive tapes. UV curable liquid optically clear adhesives are available based on acrylic or polysiloxane chemistries. Suitable adhesive tapes are available commercially, for example, from Lintec Corporation (MO series); Saint Gobain Performance Plastics (DF713 series); Nitto Americas (Nitto Denko) (LUCIACS CS9621T and LUCIAS CS9622T); LG Hausys OCA (OC9102D, OC9052D); DIC Corporation (DAITAC LT series OCA, DAITAC WS series OCA and DAITAC ZB series); PANAC Plastic Film Company (PANACLEAN series); Minnesota Mining and Manufacturing (3M, Minnesota U.S.A.—product numbers 8146, 8171, 8172, 8173, 9894, and similar products) and Adhesive Research (for example product 8932).

Some optically clear adhesive tapes comprise a carrier film, such as a polyethylene terephthalate (PET), which can be embedded in the tape between two adhesive surfaces.

Based on earlier work with organic stabilization agents, it was discovered that the presence of a carrier film in the optically clear adhesive lay was effective in combination with those stabilization agents to improve the stabilizing properties of an optically clear adhesive tape relative to corresponding films with optically clear adhesive tapes without carrier films. While not wanting to be limited by theory, the improvement in stability was speculated to be potentially due to decreased water and oxygen permeability through the carrier film. Using the metal-based stabilization agents described herein, the stabilization properties are found not to significantly depend on the specific optically clear adhesives used, which is an advantage of the present metal-based stabilization agents.

Optically clear adhesive tapes can be double sticky tapes with a carrier film between two adhesive layers, see for example 3M 8173KCL. Of course, such a double sticky structure can be created using a two adhesive tape layers with a polymer film, such as a protective surface layer 112, sandwiched between them, and presumably the effectiveness would be comparable if reproduced during production. The carrier film for the adhesive according the present invention can be normal PET thin films like that in 3M 8173KCL. More broadly other polymer films with acceptable optical and mechanical properties can also be used, such as polypropylene (PP), polycarbonate (PC), cyclic olefin polymer (COP), cyclic olefin copolymer (COC), and the like. In all cases, the carrier film can have good adhesion with the adhesive composition and provide mechanical stiffness for easier handling.

The amount of nanowires delivered onto the substrate for sparse metal conductive layer 106 can involve a balance of factors to achieve desired amounts of transparency and electrical conductivity. While thickness of the nanowire network can in principle be evaluated using scanning electron microscopy, the network can be relatively sparse to provide for optical transparency, which can complicate the measurement. In general, the sparse metal conductive structure, e.g., fused metal nanowire network, would have an average thickness of no more than about 5 microns, in further embodiments no more than about 2 microns and in other embodiments from about 10 nm to about 500 nm. However, the sparse metal conductive structures are generally relatively open structures with significant surface texture on a submicron scale. The loading levels of the nanowires can provide a useful parameter of the network that can be readily evaluated, and the loading value provides an alternative parameter related to thickness. Thus, as used herein, loading levels of nanowires onto the substrate is generally presented as milligrams of nanowires for a square meter of substrate. In general, the nanowire networks can have a loading from about 0.1 milligrams (mg)/m$^2$ to about 300 mg/m$^2$, in further embodiments from about 0.5 mg/m$^2$ to about 200 mg/m$^2$, and in other embodiments from about 1 mg/m$^2$ to about 150 mg/m$^2$. A person of ordinary skill in the art will recognize that additional ranges of thickness and loading within the explicit ranges above are contemplated and are within the present disclosure. If the sparse metal conductive layer is patterned, the thickness and loading discussion applies only to the regions where metal is not excluded or significantly diminished by the patterning process.

Generally, within the total thicknesses above for particular components of film 100, layers 102 (substrate), 104 (optional undercoat), 106 (sparse metal conductive layer), 108 (optional overcoat), 110 (optically clear adhesive layer) can be subdivided into sub-layers, for example, with different compositions from other sub-layers. For example, multiple layer optically clear adhesives are discussed above. Similarly, substrates can comprise multiple layers, such as single or double hard coated transparent films. Thus, more complex layer stacks can be formed. Sub-layers may or may not be processed similarly to other sub-layers within a particular layer, for example, one sub-layer can be laminated while another sub-layer can be coated and cured.

Stabilization compositions can be placed in appropriate layers to stabilize the sparse metal conductive layers. For embodiments in which the sparse metal conductive layers comprise fused nanostructured metal networks, the sparse metal conductive layer itself as formed may not comprise a stabilization compound since the presence of such compounds can inhibit the chemical fusing process. In alternative embodiments, it may be acceptable to include the stabilization agents in coating solutions for forming the sparse metal conductive layer. A sparse metal conductive layer can comprise a stabilization compound in a concentration from about 0.1 weight percent (wt %) to about 20 wt %, in further embodiments from about 0.25 wt % to about 15 wt % and in additional embodiments from about 0.5 wt % to about 12 wt %. A person of ordinary skill in the art will recognize that additional ranges of stabilization compound concentrations within the explicit ranges above are contemplated and are within the present disclosure.

As described herein, cobalt (+2) based stabilization compounds with appropriate ligands are described as suitable for a fused metal nanostructured layer. Similarly, stabilization compounds can be included in an optically clear adhesive composition. In some embodiments, it has been found that the stabilization compounds can be included effectively in a coating layer, which can correspondingly be made relatively thin while still providing effective stabilization.

For some applications, it is desirable to pattern the electrically conductive portions of the film to introduce desired functionality, such as distinct regions of a touch sensor. Patterning can be performed by changing the metal loading on the substrate surface either by printing metal nanowires at selected locations with other locations being effectively barren of metal or to etch or otherwise ablate metal from selected locations either before and/or after fusing the nanowires. Also, high contrast in electrical conductivity can be achieved between fused and unfused portions of a layer with essentially equivalent metal loading so that patterning can be performed by selectively fusing the metal nanowires. Patterning based on selective fusing of metal nanowires is described in the '833 application and the '669 application above.

Figure 2:
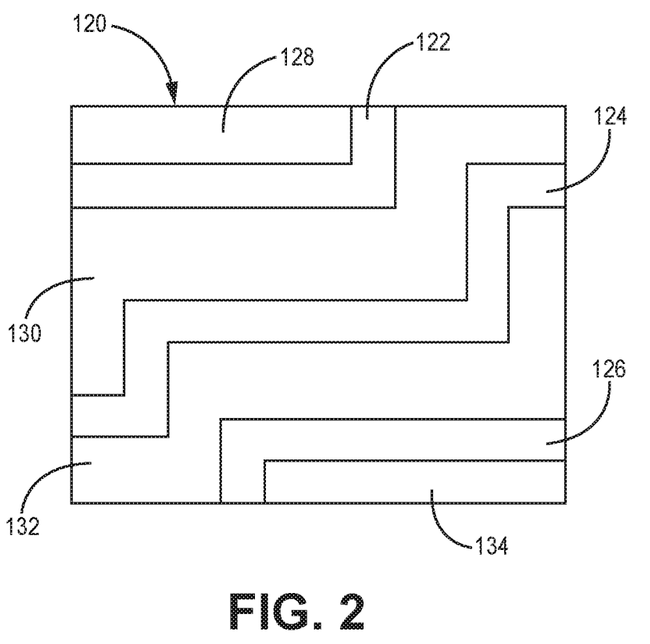
FIG. 2 is a top view of a representative schematic patterned structure with three electrically conductive pathways formed with sparse metal conductive layers.

As a schematic example, a fused metal nanostructured network can form conductive patterns along a substrate surface 120 with a plurality of electrically conductive pathways 122, 124, and 126 surrounded by electrically resistive regions 128, 130, 132, 134, as shown in FIG. 2. As shown in FIG. 2, the fused area corresponds with three distinct electrically conductive regions corresponding with electrically conductive pathways 122, 124, and 126. Although three independently connected conductive regions have been illustrated in FIG. 2, it is understood that patterns with two, four or more than 4 conductive independent conductive pathways or regions can be formed as desired. For many commercial applications, fairly intricate patterns can be formed with a large number of elements. In particular, with available patterning technology adapted for the patterning of the films described herein, very fine patterns can be formed with highly resolved features. Similarly, the shapes of the particular conductive regions can be selected as desired.

The transparent conductive film is generally built up around the sparse metal conductive element which is deposited to form the functional feature of the film. Various layers are coated, laminated or otherwise added to the structure using appropriate film processing approaches. As described herein, the nature of the layers can significant can alter the long term performance of the transparent conductive film. The deposit of the sparse metal conductive layer is described further below in the context of a fused metal nanostructured layers, but un-fused metal nanowire coatings can be similarly deposited except that the fusing components are absent.

The sparse metal conductive layer generally is solution coated onto a substrate, which may or may not have a coating layer on top of the substrate that if present forms an undercoat adjacent the sparse metal conductive layer. An overcoat can be solution coated onto the sparse metal conductive layer in some embodiments. Crosslinking, with application of UV light, heat or other radiation, can be performed to crosslink polymer binders in the coating layers and/or the sparse metal conductive layer, which can be performed in one step or multiple steps. A stabilization compound can be incorporated into the coating solution for forming a coating layer. The coating precursor solution can comprise 0.0001 weight percent (wt %) to about 1 wt % stabilization compound, in further embodiments from about 0.0005 wt % to about 0.75 wt %, in additional embodiments from about 0.001 wt % to about 0.5 wt % and in other embodiments from about 0.002 wt % to about 0.25 wt % stabilization compound. From another perspective, the cobalt ions in the ink composition can be considered as a molar ratio relative to silver in the silver nanowires. The cobalt ions can generally have a molar ratio relative to silver nanowires from about 0.01 to about 0.5, in further embodiments from about 0.02 to about 0.4, and in additional embodiments from about 0.03 to about 0.3 molar ratio relative to silver nanowires. A person of ordinary skill in the art will recognize that additional ranges of stabilization compound or cobalt ion molar ratio in a coating solution within the explicit ranges above are contemplated and are within the present disclosure.

An optically clear adhesive layer can be laminated or otherwise applied to the sparse metal conductive layer with or without an overcoat layer(s) that becomes located adjacent the optically clear adhesive. A stabilization composition can be associated with an optically clear adhesive through the contact of a solution comprising the stabilization compound with the optically clear adhesive, such as by spraying or dipping a solution of the stabilization compound with the optically clear adhesive. Alternatively or additionally, the stabilization compound can be incorporated into the adhesive composition during the manufacture of the adhesive. In some embodiments, an additional protective film can be applied over the optically clear adhesive layer, or a protective polymer film can be laminated or otherwise applied to an overcoat or directly to the sparse metal conductive layer without an intervening optically conductive adhesive.

While the mechanisms of temporal degradation of the electrically conductive ability of the sparse metal conductive layers is not completely understood, it is believed that molecular oxygen ($O_2$) and/or water vapor may play a role. From this perspective, barrier films to oxygen and/or water vapor would be desirable, and physical barrier tend to block migration of environmental contaminants generally. The '661 application describes commercial oxygen barrier films with inorganic coatings on PET substrates and asserted improvement in stability based on these barrier films. Desirable barrier films can provide good optical properties. The barrier films generally can have a thickness ranging from about 10 microns to about 300 microns, in further embodiments from about 15 microns to about 250 microns and in other embodiments from about 20 microns to about 200 microns. In some embodiments, the barrier films can have a water vapor permeability of no more than about 0.15 g/($m^2$·day), in further embodiments no more than about 0.1 g/($m^2$·day) and in additional embodiments no more than about 0.06 g/($m^2$·day). Furthermore, the barrier films can have an optical total transmittance of visible light of at least about 86%, in further embodiments at least about 88% and in other embodiments at least about 90.5%. A person of ordinary skill in the art will recognize that additional ranges of thickness, total transmittance and water vapor permeability within the explicit ranges above are contemplated and are within the present disclosure. Generally, barrier films may have a supportive core of similar polymers, such as PET, in combination with ceramic, metallic, or other materials contributing to the barrier function.

A protective film can be placed over the optically clear adhesive to form a further protective layer. Suitable protective films can be formed of similar materials as described for the substrate material, or specific commercial transparent films can be used. For example, the protective films can be formed from polyester sheets with coatings. Protective films can also function as barrier films to help block environmental contaminants from reaching the conductive layer. In some embodiments, good stability results have been obtained with basic protective polymer films that are not formally sold as barrier films. Thus, clear protective polymer films can comprise, for example, polyethylene terephthalate (PET), hard coated PET (HC-PET) that can have a hard coat on one or both sides, polycarbonate, cyclic olefin polymer, cyclic olefin copolymers, or combinations thereof. Hard coated polyester sheets are commercially available, in which the hard coats are crosslinked acrylic polymers or other crosslinked polymers. Hard coated polyester sheets are desirable due to a relatively low cost and desirable optical properties, such as a high transparency and low haze. Thicker hard coated polyester films can be used to increase their barrier function, such as sheets having a thickness from about 10 microns to about 300 microns, in some embodiments from about 15 microns to about 200 microns and in further embodiments from about 20 microns to about 150 microns. A person of ordinary skill in the art will recognize that additional ranges of hard coated polyester films are contemplated and are within the present disclosure. While the basic protective polymer films may not provide equivalent reduction in water vapor or molecular oxygen migration as commercial barrier films, these films can provide suitable stabilization at a modest cost and desirable optical properties especially when used in combination with an optically clear adhesive with a carrier film.

Optically clear adhesive layers and protective films covering the sparse metal conductive layer can be formed with holes or the like in appropriate locations to provide for electrical connections to the conductive layer. In general, various polymer film processing techniques and equipment can be used to the processing of these polymer sheets, and such equipment and techniques are well developed in the art, and future developed processing techniques and equipment can be correspondingly adapted for the materials herein.

Sparse Metal Conductive Layers

Sparse metal conductive layers are generally formed from metal nanowires. With sufficient loading and selected nanowire properties, reasonable electrical conductivity can be achieved with the nanowires with corresponding appropriate optical properties. It is expected that the stabilized film structures described herein can yield desirable performance for films with various sparse metal conductive structures. However, particularly desirable properties have been achieved with fused metal nanostructured networks.

As summarized above, several practical approaches have been developed to accomplish the metal nanowire fusing. The metal loading can be balanced to achieve desirable levels of electrical conductivity with good optical properties. In general, the metal nanowire processing can be accomplished through deposition of two inks with the first ink comprising the metal nanowires and the second ink comprising a fusing composition, or through the deposition of an ink that combines the fusing elements into the metal nanowire dispersion. A one ink system for forming the fused metal nanostructured network is described in the Examples. The inks may or may not further comprise additional processing aids, binders or the like. Suitable patterning approaches can be selected to be suitable for the particular ink system.

In general, one or more solutions or inks for the formation of the metal nanostructured network can collectively comprise well dispersed metal nanowires, a fusing agent, and optional additional components, for example, a polymer binder, a crosslinking agent, a wetting agent, e.g., a surfactant, a thickener, a dispersant, other optional additives or combinations thereof. The solvent for the metal nanowire ink and/or the fusing solution if distinct from the nanowire ink can comprise an aqueous solvent, an organic solvent or mixtures thereof. In particular, suitable solvents include, for example, water, alcohols, ketones, esters, ethers, such as glycol ethers, aromatic compounds, alkanes, and the like and mixtures thereof. Specific solvents include, for example, water, ethanol, isopropyl alcohol, isobutyl alcohol, n-butanol, tertiary butyl alcohol, methyl ethyl ketone, glycol ethers, methyl isobutyl ketone, toluene, hexane, ethyl acetate, butyl acetate, ethyl lactate, PGMEA (2-methoxy-1-methylethylacetate), or mixtures thereof. Some inks can comprise aqueous solutions with a liquid alcohol or blend of liquid alcohols in concentrations from about 2 weight percent to about 60 wt %, in further embodiments from about 4 wt % to about 50 wt % and in additional embodiments from about 6 wt % to about 40 wt %. A person of ordinary skill in the art will recognize that additional ranges within the specific ranges above are contemplated and are within the present disclosure. While the solvent should be selected based on the ability to form a good dispersion of metal nanowires, the solvents should also be compatible with the other selected additives so that the additives are soluble in the solvent. For embodiments in which the fusing agent is included in a single solution with the metal nanowires, the solvent or a component thereof may or may not be a significant component of the fusing solution, such as alcohols and can be selected accordingly if desired.

The metal nanowire ink, in either a one ink or two ink configuration, can include from about 0.01 to about 1 weight percent metal nanowires, in further embodiments from about 0.02 to about 0.75 weight percent metal nanowires and in additional embodiments from about 0.04 to about 0.6 weight percent metal nanowires. A person of ordinary skill in the art will recognize that additional ranges of metal nanowire concentrations within the explicit ranges above are contemplated and are within the present disclosure. The concentration of metal nanowires influences the loading of metal on the substrate surface as well as the physical properties of the ink. Metal ion sources for driving a fusing process can be an oxidizing agent, such as an oxidizing acid, that removes metal from the metal nanowires or a metal salt dissolved in the ink. For embodiments of particular interest, the nanowires are silver nanowires and the metal ion source is a dissolved silver salt. The ink can comprise silver ions in a concentration from about 0.01 mg/mL and about 2.0 mg/mL silver ions, in further embodiments from about 0.02 mg/mL and about 1.75 mg/mL and in other embodiments from about 0.025 mg/mL and about 1.5 mg/mL. The silver ions are in addition to the cobalt+2 stabilization complexes, which generally are present in a concentration such that the cobalt 2+ remains un-reduced while the silver ions are preferentially reduced. The ink can comprise cobalt stabilization compositions in concentrations from about 0.0001 wt % to about 0.1 weight percent, in further embodiments from about 0.0005 wt % to about 0.08 wt % and in additional embodiments from about 0.001 wt % to about 0.05 wt %. A person of ordinary skill in the art will recognize that additional ranges of silver ion concentrations and cobalt stabilization compositions within the explicit ranges above are contemplated and are within the present disclosure.

In general, the nanowires can be formed from a range of metals, such as silver, gold, indium, tin, iron, cobalt, platinum, palladium, nickel, cobalt, titanium, copper and alloys thereof, which can be desirable due to high electrical conductivity. Commercial metal nanowires are available from Sigma-Aldrich (Missouri, USA), Cangzhou Nano-Channel Material Co., Ltd. (China), Blue Nano (North Carolina, U.S.A.), EMFUTUR (Spain), Seashell Technologies (California, U.S.A.), Aiden/C3Nano (Korea/U.S.A.), Nanocomposix (U.S.A.), Nanopyxis (Korea), K&B (Korea), ACS Materials (China), KeChuang Advanced Materials (China), and Nanotrons (USA). Alternatively, silver nanowires can also be synthesized using a variety of known synthesis routes or variations thereof. Silver in particular provides excellent electrical conductivity, and commercial silver nanowires are available. To have good transparency and low haze, it is desirable for the nanowires to have a range of small diameters. In particular, it is desirable for the metal nanowires to have an average diameter of no more than about 250 nm, in further embodiments no more than about 150 nm, and in other embodiments from about 10 nm to about 120 nm. With respect to average length, nanowires with a longer length are expected to provide better electrical conductivity within a network. In general, the metal nanowires can have an average length of at least a micron, in further embodiments, at least 2.5 microns and in other embodiments from about 5 microns to about 100 microns, although improved synthesis techniques developed in the future may make longer nanowires possible. An aspect ratio can be specified as the ratio of the average length divided by the average diameter, and in some embodiments, the nanowires can have an aspect ratio of at least about 25, in further embodiments from about 50 to about 10,000 and in additional embodiments from about 100 to about 2000. A person of ordinary skill in the art will recognize that additional ranges of nanowire dimensions within the explicit ranges above are contemplated and are within the present disclosure.

Polymer binders and the solvents are generally selected consistently such that the polymer binder is soluble or dispersible in the solvent. In appropriate embodiments, the metal nanowire ink generally comprises from about 0.02 to about 5 weight percent binder, in further embodiments from about 0.05 to about 4 weight percent binder and in additional embodiments from about 0.075 to about 2.5 weight percent polymer binder. In some embodiments, the polymer binder comprises a crosslinkable organic polymer, such as a radiation crosslinkable organic polymer and/or a heat curable organic binder. To facilitate the crosslinking of the binder, the metal nanowire ink can comprise in some embodiments from about 0.0005 wt % to about 1 wt % of a crosslinking agent, in further embodiments from about 0.002 wt % to about 0.5 wt % and in additional embodiments from about 0.005 to about 0.25 wt %. The nanowire ink can optionally comprise a rheology modifying agent or combinations thereof. In some embodiments, the ink can comprise a wetting agent or surfactant to lower the surface tension, and a wetting agent can be useful to improve coating properties. The wetting agent generally is soluble in the solvent. In some embodiments, the nanowire ink can comprise from about 0.01 weight percent to about 1 weight percent wetting agent, in further embodiments from about 0.02 to about 0.75 weight percent and in other embodiments from about 0.03 to about 0.6 weight percent wetting agent. A thickener can be used optionally as a rheology modifying agent to stabilize the dispersion and reduce or eliminate settling. In some embodiments, the nanowire ink can comprise optionally from about 0.05 to about 5 weight percent thickener, in further embodiments from about 0.075 to about 4 weight percent and in other embodiments from about 0.1 to about 3 weight percent thickener. A person of ordinary skill in the art will recognize that additional ranges of binder, wetting agent and thickening agent concentrations within the explicit ranges above are contemplated and are within the present disclosure.

A range of polymer binders can be suitable for dissolving/dispersing in a solvent for the metal nanowires, and suitable binders include polymers that have been developed for coating applications. Hard coat polymers, e.g., radiation curable coatings, are commercially available, for example as hard coat materials for a range of application that can be selected for dissolving in aqueous or non-aqueous solvents. Suitable classes of radiation curable polymers and/or heat curable polymers include, for example, polyurethanes, acrylic resins, acrylic copolymers, cellulose ethers and esters, other water insoluble structural polysaccharides, polyethers, polyesters, epoxy containing polymers, and mixtures thereof. Examples of commercial polymer binders include, for example, NEOCRYL® brand acrylic resin (DMS NeoResins), JONCRYL® brand acrylic copolymers (BASF Resins), ELVACITE® brand acrylic resin (Lucite International), SANCURE® brand urethanes (Lubrizol Advanced Materials), cellulose acetate butyrate polymers (CAB brands from Eastman™ Chemical), BAYHYDROL™ brand polyurethane dispersions (Bayer Material Science), UCECOAT® brand polyurethane dispersions (Cytec Industries, Inc.), MOWITOL® brand polyvinyl butyral (Kuraray America, Inc.), cellulose ethers, e.g., ethyl cellulose or hydroxypropyl methyl cellulose, other polysaccharide based polymers such as Chitosan and pectin, synthetic polymers like polyvinyl acetate, and the like. The polymer binders can be self-crosslinking upon exposure to radiation, and/or they can be crosslinked with a photoinitiator or other crosslinking agent. In some embodiments, photocrosslinkers may form radicals upon exposure to radiation, and the radicals then induce crosslinking reactions based on radical polymerization mechanisms. Suitable photoinitiators include, for example, commercially available products, such as IRGACURE® brand (BASF), GENOCURE™ brand (Rahn USA Corp.), and DOUBLECURE® brand (Double Bond Chemical Ind., Co, Ltd.), combinations thereof or the like.

Wetting agents can be used to improve the coatability of the metal nanowire inks as well as the quality of the metal nanowire dispersion. In particular, the wetting agents can lower the surface energy of the ink so that the ink spreads well onto a surface following coating. Wetting agents can be surfactants and/or dispersants. Surfactants are a class of materials that function to lower surface energy, and surfactants can improve solubility of materials. Surfactants generally have a hydrophilic portion of the molecule and a hydrophobic portion of the molecule that contributes to its properties. A wide range of surfactants, such as nonionic surfactants, cationic surfactant, anionic surfactants, zwitterionic surfactants, are commercially available. In some embodiments, if properties associated with surfactants are not an issue, non-surfactant wetting agents, e.g., dispersants, are also known in the art and can be effective to improve the wetting ability of the inks. Suitable commercial wetting agents include, for example, COATOSIL™ brand epoxy functionalized silane oligomers (Momentum Performance Materials), Triton™ X-100, SILWET™ brand organo silicone surfactant (Momentum Performance Materials), THETAWET™ brand short chain non-ionic fluorosurfactants (ICT Industries, Inc.), ZETASPERSE® brand polymeric dispersants (Air Products Inc.), SOLSPERSE® brand polymeric dispersants (Lubrizol), XOANONS WE-D545 surfactant (Anhui Xoanons Chemical Co., Ltd), EFKA™ PU 4009 polymeric dispersant (BASF), CAPSTONE® FS-30, FS-31, FS-3100, FS-34, and FS-35 Fluorosurfactants (DuPont), MASURF FP-815 CP, MASURF FS-910 (Mason Chemicals), NOVEC™ FC-4430 fluorinated surfactant (3M), mixtures thereof, and the like.

Thickeners can be used to improve the stability of the dispersion by reducing or eliminating settling of the solids from the metal nanowire inks. Thickeners may or may not significantly change the viscosity or other fluid properties of the ink. Suitable thickeners are commercially available and include, for example, CRAYVALLAC™ brand of modified urea such as LA-100 (Cray Valley Acrylics, USA), polyacrylamide, THIXOL™ 53 L brand acrylic thickener, COAPUR™ 2025, COAPUR™ 830 W, COAPUR™ 6050, COAPUR™ XS71 (Coatex, Inc.), BYK® brand of modified urea (BYK Additives), Acrysol DR 73, Acrysol RM-995, Acrysol RM-8W (Dow Coating Materials), Aquaflow NHS-300, Aquaflow XLS-530 hydrophobically modified polyether thickeners (Ashland Inc.), Borchi Gel L 75 N, Borchi Gel PW25 (OMG Borchers), and the like.

Additional additives can be added to the metal nanowire ink, generally each in an amount of no more than about 5 weight percent, in further embodiments no more than about 2 weight percent and in further embodiments no more than about 1 weight percent. Other additives can include, for example, anti-oxidants, UV stabilizers, defoamers or anti-foaming agents, anti-settling agents, viscosity modifying agents, or the like.

As noted above, fusing of the metal nanowires can be accomplished through various agents. Without wanting to be limited by theory, the fusing agents are believed to mobilize metal ions, and the free energy seems to be lowered in the fusing process. Excessive metal migration or growth may lead in some embodiments to a degeneration of the optical properties, so desirable results can be achieved through a shift in equilibrium in a reasonably controlled way, generally for a short period of time, to generate sufficient fusing to obtain desired electrical conductivity while maintaining desired optical properties. In some embodiments, initiation of the fusing process can be controlled through a partial drying of the solutions to increase concentrations of the components, and quenching of the fusing process can be accomplished, for example, through rinsing or more completing drying of the metal layer. The fusing agent can be incorporated into a single ink along with the metal nanowires. The one ink solution can provide appropriate control of the fusing process.

For the deposition of the metal nanowire ink, any reasonable deposition approach can be used, such as dip coating, spray coating, knife edge coating, bar coating, Meyer-rod coating, slot-die coating, gravure printing, spin coating or the like. The ink can have properties, such as viscosity, adjusted appropriately with additives for the desired deposition approach. Similarly, the deposition approach directs the amount of liquid deposited, and the concentration of the ink can be adjusted to provide the desired loading of metal nanowires on the surface. After forming the coating with the dispersion, the sparse metal conductive layer can be dried to remove the liquid.

The films can be dried, for example, with a heat gun, an oven, a thermal lamp or the like, although the films that can be air dried if desired in some embodiments. In some embodiments, the films can be heated to temperatures from about 50° C. to about 150° C. during drying. After drying, the films can be washed one or more times, for example, with an alcohol or other solvent or solvent blend, such as ethanol or isopropyl alcohol, to removed excess solids to lower haze. Patterning can be achieved in several convenient ways. For example, printing of the metal nanowires can directly result in patterning. Additionally or alternatively, lithographic techniques can be used to remove portions of the metal nanowires, prior to or after fusing, to form a pattern.

Transparent Film Electrical and Optical Properties

The fused metal nanostructured networks can provide low electrical resistance while providing good optical properties. Thus, the films can be useful as transparent conductive electrodes or the like. The transparent conductive electrodes can be suitable for a range of applications such as electrodes along light receiving surfaces of solar cells. For displays and in particular for touch screens, the films can be patterned to provide electrically conductive patterns formed by the film. The substrate with the patterned film, generally has good optical properties at the respective portions of the pattern.

Electrical resistance of thin films can be expressed as a sheet resistance, which is reported in units of ohms per square (Ω/□ or ohms/sq) to distinguish the values from bulk electrical resistance values according to parameters related to the measurement process. Sheet resistance of films is generally measured using a four point probe measurement or another suitable process. In some embodiments, the fused metal nanowire networks can have a sheet resistance of no more than about 300 ohms/sq, in further embodiments no more than about 200 ohms/sq, in additional embodiments no more than about 100 ohms/sq and in other embodiments no more than about 60 ohms/sq. A person of ordinary skill in the art will recognize that additional ranges of sheet resistance within the explicit ranges above are contemplated and are within the present disclosure. Depending on the particular application, commercial specifications for sheet resistances for use in a device may not be necessarily directed to lower values of sheet resistance such as when additional cost may be involved, and current commercially relevant values may be for example, 270 ohms/sq, versus 150 ohms/sq, versus 100 ohms/sq, versus 50 ohms/sq, versus 40 ohms/sq, versus 30 ohms/sq or less as target values for different quality and/or size touch screens, and each of these values defines a range between the specific values as end points of the range, such as 270 ohms/sq to 150 ohms/sq, 270 ohms/sq to 100 ohms/sq, 150 ohms/sq to 100 ohms/sq and the like with 15 particular ranges being defined. Thus, lower cost films may be suitable for certain applications in exchange for modestly higher sheet resistance values. In general, sheet resistance can be reduced by increasing the loading of nanowires, but an increased loading may not be desirable from other perspectives, and metal loading is only one factor among many for achieving low values of sheet resistance.

For applications as transparent conductive films, it is desirable for the fused metal nanowire networks to maintain good optical transparency. In principle, optical transparency is inversely related to the loading with higher loadings leading to a reduction in transparency, although processing of the network can also significantly affect the transparency. Also, polymer binders and other additives can be selected to maintain good optical transparency. The optical transparency can be evaluated relative to the transmitted light through the substrate. For example, the transparency of the conductive film described herein can be measured by using a UV-Visible spectrophotometer and measuring the total transmission through the conductive film and support substrate. Transmittance is the ratio of the transmitted light intensity (I) to the incident light intensity ($I_o$). The transmittance through the film ($T_{film}$) can be estimated by dividing the total transmittance (T) measured by the transmittance through the support substrate ($T_{sub}$). (T=I/$I_o$ and T/$T_{sub}$=(I/$I_o$)/($I_{sub}$/$I_o$)=I/$I_{sub}$=$T_{film}$). Thus, the reported total transmissions can be corrected to remove the transmission through the substrate to obtain transmissions of the film alone. While it is generally desirable to have good optical transparency across the visible spectrum, for convenience, optical transmission can be reported at 550 nm wavelength of light. Alternatively or additionally, transmission can be reported as total transmittance from 400 nm to 700 nm wavelength of light, and such results are reported in the Examples below. In general, for the fused metal nanowire films, the measurements of 550 nm transmittance and total transmittance from 400 nm to 700 nm (or just "total transmittance" for convenience) are not qualitatively different. In some embodiments, the film formed by the fused network has a total transmittance (TT %) of at least 80%, in further embodiments at least about 85%, in additional embodiments, at least about 90%, in other embodiments at least about 94% and in some embodiments from about 95% to about 99%. Transparency of the films on a transparent polymer substrate can be evaluated using the standard ASTM D1003 ("Standard Test Method for Haze and Luminous Transmittance of Transparent Plastics"), incorporated herein by reference. A person or ordinary skill in the art will recognize that additional ranges of transmittance within the explicit ranges above are contemplated and are within the present disclosure. When adjusting the measured optical properties for the films in the Examples below for the substrate, the films have very good transmission and haze values, which are achieved along with the low sheet resistances observed.

The fused metal networks can also have low haze along with high transmission of visible light while having desirably low sheet resistance. Haze can be measured using a hazemeter based on ASTM D1003 referenced above, and the haze contribution of the substrate can be removed to provide haze values of the transparent conductive film. In some embodiments, the sintered network film can have a haze value of no more than about 1.2%, in further embodiments no more than about 1.1%, in additional embodiments no more than about 1.0% and in other embodiments from about 0.9% to about 0.2%. As described in the Examples, with appropriately selected silver nanowires very low values of haze and sheet resistance have been simultaneously achieved. The loading can be adjusted to balance the sheet resistance and the haze values with very low haze values possible with still good sheet resistance values. Specifically, haze values of no more than 0.8%, and in further embodiments from about 0.4% to about 0.7%, can be achieved with values of sheet resistance of at least about 45 ohms/sq. Also, haze values of 0.7% to about 1.2%, and in some embodiments from about 0.75% to about 1.05%, can be achieved with sheet resistance values of from about 30 ohms/sq to about 45 ohms/sq. All of these films maintained good optical transparency. A person of ordinary skill in the art will recognize that additional ranges of haze within the explicit ranges above are contemplated and are within the present disclosure.

With respect to the corresponding properties of the multilayered films, the additional components are generally selected to have a small effect on the optical properties, and various coatings and substrates are commercially available for use in transparent elements. Suitable optical coatings, substrates and associated materials are summarized above. Some of the structural material can be electrically insulating, and if thicker insulating layers are used, the film can be patterned to provide locations where gaps or voids through the insulating layers can provide access and electrical contact to the otherwise embedded electrically conductive element. Some components of the ultimate device can be covered from view with an opaque or translucent covering to hide from view portions of the structure, such as connections through to the electrically conductive transparent elements. The covering can shield the conductive layer from light, but heats up due to light absorption, and cover tape and edges at the transition between transparent and covered regions can have stability issues that are addressed in the Examples.

Transparent Electrically Conductive Film Stability and Stability Testing

In use, it is desirable for the transparent conductive films to last a commercially acceptable time, such as the lifetime of the corresponding device. The stabilization compositions and structures described herein have this objective in view, and the properties of the sparse metal conductive layers are sufficiently maintained. To test the performance, accelerated aging procedures can be used to provide objective evaluation over a reasonable period of time. These tests can be performed using commercially available environmental test equipment.

A selected test, which is used in the Examples involves black standard temperature of 60° C. (a setting of the apparatus), an air temperature of 38° C., a relative humidity of 50% and an irradiance of 60 W/m² (300 nm to 400 nm) from xenon lamps with a daylight filter. A variety of suitable test equipment is commercially available, such as Atlas Suntest™ XXL apparatus (Atlas Material Testing Solutions, Chicago, Ill., USA) and a SUGA environmental test instrument, Super Xenon Weather Meter, SX75 (SUGA Test Instruments Co., Limited, Japan). The Examples provide testing with two different stack structures incorporating fused metal nanostructures networks, and the specific stack structures are described below.

Under the test conditions specified in the previous paragraph, a sample can be evaluated by the change in sheet resistance as a function of time. The values can be normalized to the initial sheet resistance to focus on the time evolution. So generally the time evolution is plotted for $R_t/R_0$, where $R_t$ is the time evolving sheet resistance measurement and $R_0$ is the initial value of sheet resistance. In some embodiments, the value of $R_t/R_0$ can be no more than a value of 1.8 after 1000 hour, in further embodiments no more than a value of 1.6 and in additional embodiment no more than a value of 1.4 after 1000 hours of environmental testing. From another perspective, the value of $R_t/R_0$ can be no more than a value of 1.5 after about 1000 hours, in further embodiments no more than a value of 1.5 after about 1500 hours and in additional embodiments no more than a value of 1.5 after about 2000 hours of environmental testing. In additional embodiments, the value of $R_t/R_0$ can be no more than a value of 1.2 after about 750 hours. A person of ordinary skill in the art will recognize that additional ranges of $R_t/R_0$ and stability times within the explicit ranges above are contemplated and are within the present disclosure.

One useful feature of stabilized conductive films is that the change in $R_t/R_0$ is gradual, such that no catastrophic failure of the film is to happen within a short period of time under testing. In some embodiments, the change in $R_t/R_0$ remains less than 0.5 per any 100 hour increments at a total of about 2000 hrs, in further embodiment no more than about 0.3, in other embodiments no more than about 0.2, and in additional embodiments no more than about 0.15 per any 100 hour increment at a total of about 2000 hours. A person of ordinary skill in the art will recognize that additional ranges of stability over time increments within the explicit ranges above are contemplated and are within the present disclosure.

EXAMPLES

The following Examples make use of a single ink comprising a solvent with a stable dispersion of silver nanowires, a polymer binder and a fusing solution. The silver nanowire ink was essentially as described in Example 5 of U.S. Pat. No. 9,150,746 B1 to Li et al., entitled "Metal Nanowire Inks for the Formation of Transparent Conductive Films With Fused Networks," incorporated herein by reference. AgNW typically is present in the ink at a level between 0.06 to 1.0 wt % and the binder at about 0.01 to 1 wt %. The ink was slot coated onto a PET polyester film. After coating the nanowire inks, the films were then heated in an oven at 120° C. for 2 min to dry the films. The stabilization compound coating composition was similarly slot coated onto the fused metal nanostructured layer. Unless otherwise indicated, the concentration of a stabilization compound was about 0.01-0.03 wt % in solution and 1.0-3.5 wt % in the coating. The film was then cured with UV light. The particular coating solution was designed for the formation of fused metal nanostructured network with a sheet resistance of no more than about 100 ohms/sq. and a transparency of at least about 90%. But it is expected that the observed stability would correspondingly be observed for metal nanowire based conductive films. In all of the examples, the optical properties of the stabilized films are generally not significantly altered from the corresponding films without a chemical stabilization agent.

Metavanadate compounds are described at—http://vanadium.atomistry.com/metavanadates.html, incorporated herein by reference as of the filing date of this application.

Two sets of experiments were performed with similar but somewhat different testing configurations. The two sets of experiments are sequentially discussed.

First Set of Experiments—Test Configuration A

Figure 3:
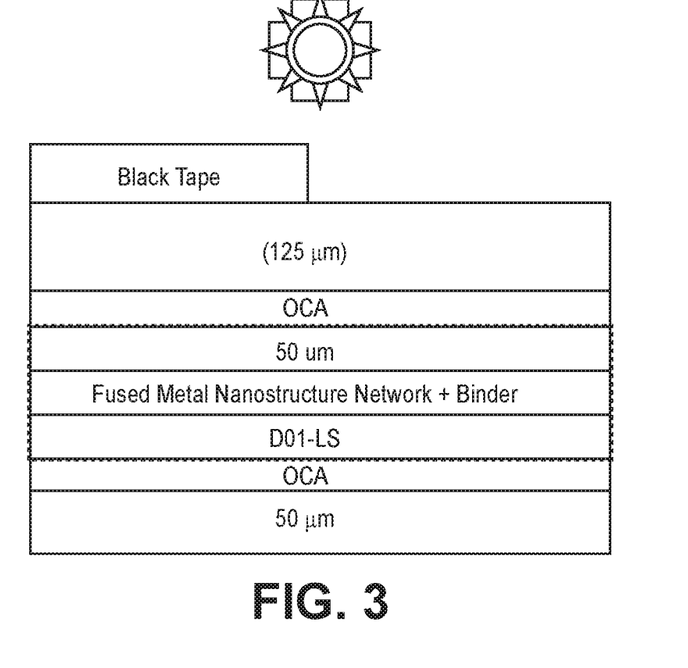
FIG. 3 is a schematic drawing of a layered stack incorporating a transparent conductive layer in a first test structure.

The tests were performed with a film having a PET substrate (50 microns), a fused metal nanostructured layer, a polymer overcoat (200 nm), an optically clear adhesive (50 or 125 microns) and a laminated polymer cover (50 microns), which was a commercial hard coated PET polyester. The test film configuration is shown in FIG. 3. Except as noted in specific examples, to the back of the PET substrate was applied another optically clear adhesive (50 or 125 microns) and an additional laminated hard coated polyester cover (125 microns). The total thicknesses of the films were about 325 microns or about 475 microns. All samples were formed in duplicate and average results are reported.

Accelerated weathering testing was performed in an Atlas Suntest™ XXL apparatus (Atlas Material Testing Solutions, Chicago, Ill., USA). The conditions in the testing apparatus had a black standard temperature of 60° C. (a setting of the apparatus), an air temperature of 38° C., a relative humidity of 50%, and an irradiance of 60 W/m$^2$ (300 nm to 400 nm) from xenon lamps with a daylight filter. The hard coated-PET back cover sheet was placed facing upward toward the light in the apparatus and about half of the area was covered with black tape, unless indicated otherwise.

Second Set of Experiments—Test Configuration B

Figure 4:
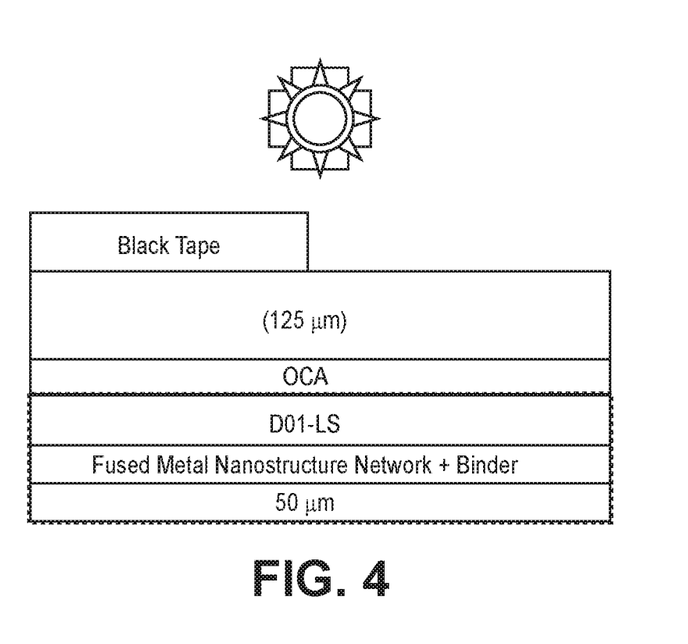
FIG. 4 is a schematic drawing of a layered stack incorporating a transparent conductive layer in a second test structure.

The tests were performed with a film having a PET substrate (50 microns), a fused metal nanostructured layer, a polymer overcoat (200 nm), an optically clear adhesive (50 or 125 microns) and a laminated polymer cover (125 microns), which was a commercial hard coated PET polyester. The test film configuration is shown in FIG. 4. The total thicknesses of the films were from about 200 microns to about 350 microns. All samples were formed in duplicate and average results are reported.

Accelerated weathering testing was performed in an Atlas Suntest™ XXL apparatus (Atlas Material Testing Solutions, Chicago, Ill., USA). The conditions in the testing apparatus had a black standard temperature of 60° C. (a setting of the apparatus), an air temperature of 38° C. a relative humidity of 50% and an irradiance of 60 W/m$^2$ (300 nm to 400 nm) from xenon lamps with a daylight filter. The laminated hard coated-PET cover sheet was placed facing upward toward the light in the apparatus and about half of the area was covered with black tape, unless indicated otherwise.

Example 1—Transparent Conductive Films with Overcoats Having Vanadium Oxytripropoxide (LS-1) Stabilization Compositions This example demonstrates the effectiveness of stabilization compound LS-1 placed in an overcoat layer.

Figure 5:
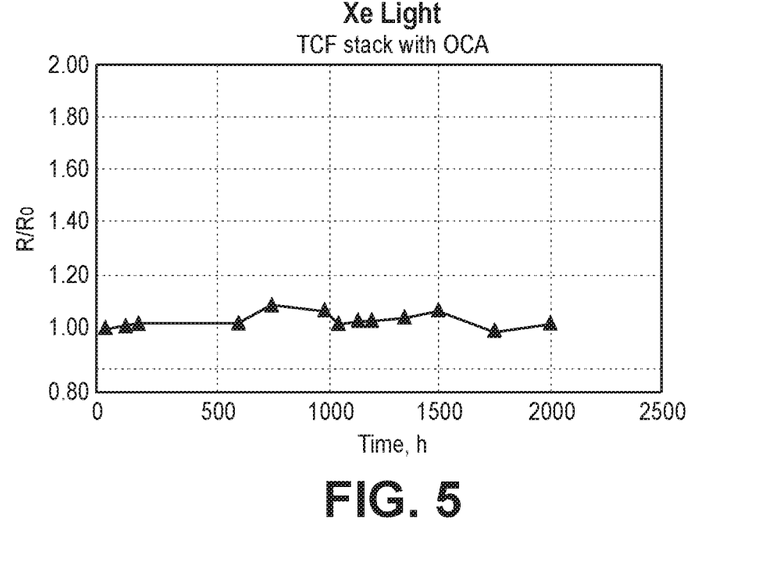
FIG. 5 is a plot of change in sheet resistance as a function of time of exposure to test conditions for a sample having an overcoat with LS-1 stabilizer, an optically clear adhesive and a hard coated PET cover as in Configuration A (full stack with half black tape on top).

A set of samples was prepared according to test configuration A with LS-1 stabilizer in a commercial overcoat solution OC-1. The stabilization compound was in the overcoat layer at a concentration of 3 wt % relative to the solids in the layer. The test results for LS-1 are shown in FIG. 5 for Xe light irradiation stability. The results demonstrate excellent stabilization to greater than 2000 hrs under the test conditions.

Example 2—Transparent Conductive Films with Overcoats Having Vanadium Oxytripropoxide (LS-1) Stabilization Compositions at Different Levels in Configuration B This example demonstrates the effectiveness of stabilization compound LS-1 placed in an overcoat layer and in stack Configuration B.

Figure 6:
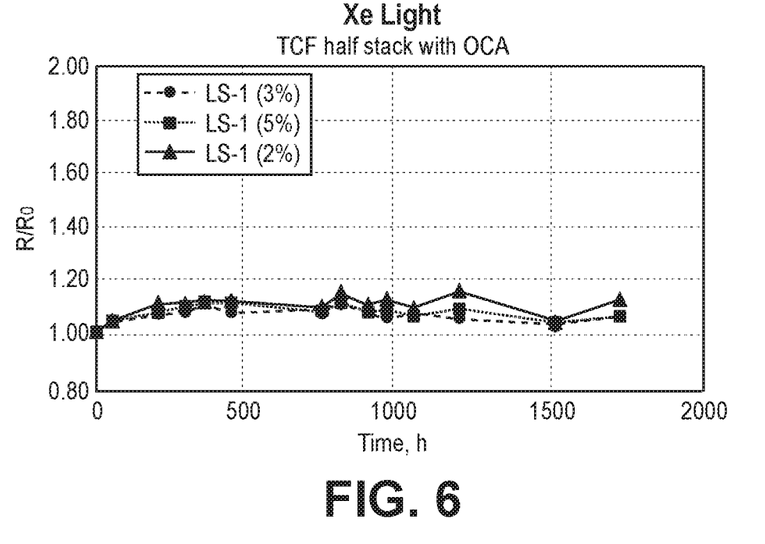
FIG. 6 is a plot of change in sheet resistance as a function of time of exposure to test conditions for a sample having an overcoat with LS-1 at three different levels, an optically clear adhesive and a hard coated PET cover as in Configuration B (half stack with half black tape on top).

A set of samples was prepared according to test configuration B with LS-1 stabilizer in a commercial overcoat solution OC-1 at three different levels. The stabilization compound was in the overcoat layer at a concentration of 2, 3, and 5 wt % relative to the solids in the layer. The test results are shown in FIG. 6 for Xe light irradiation stability. The results demonstrate excellent stabilization with respect to Xe light irradiation stability to greater than 1700 hrs under the test conditions.

Example 3. Transparent Conductive Films with Overcoats Having Sodium Metavanadate (LS-2) Stabilization Compositions This example demonstrates the effectiveness of stabilization compound LS-2 placed in an overcoat layer.

Figure 7:
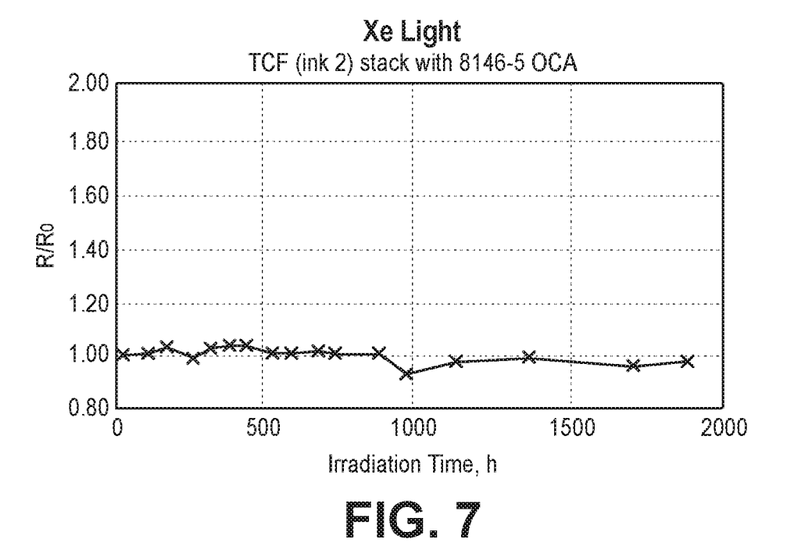
FIG. 7 is a plot of change in sheet resistance as a function of time of exposure to test conditions for a sample having an overcoat with LS-2, an optically clear adhesive and a hard coated PET cover as in Configuration B (half stack with half black tape on top).

A set of samples was prepared according to test configuration B with LS-2 stabilizer in a commercial overcoat solution OC-1. The stabilization compound was placed in the overcoat layer at a concentration of 3 wt % relative to the solids in the layer. The results for LS-2 are shown in FIG. 7 for Xe light irradiation stability. The results demonstrate excellent stabilization to near 2000 hrs under the test conditions.

When the test was terminated the sample showed no trend of increasing resistance.

Example 4—Transparent Conductive Films with Overcoats Having Tetra-n-Butylammonium Metavanadate (LS-3) Stabilization Compositions This example demonstrates the effectiveness of stabilization compound LS-3 placed in an overcoat layer.

Figure 8:
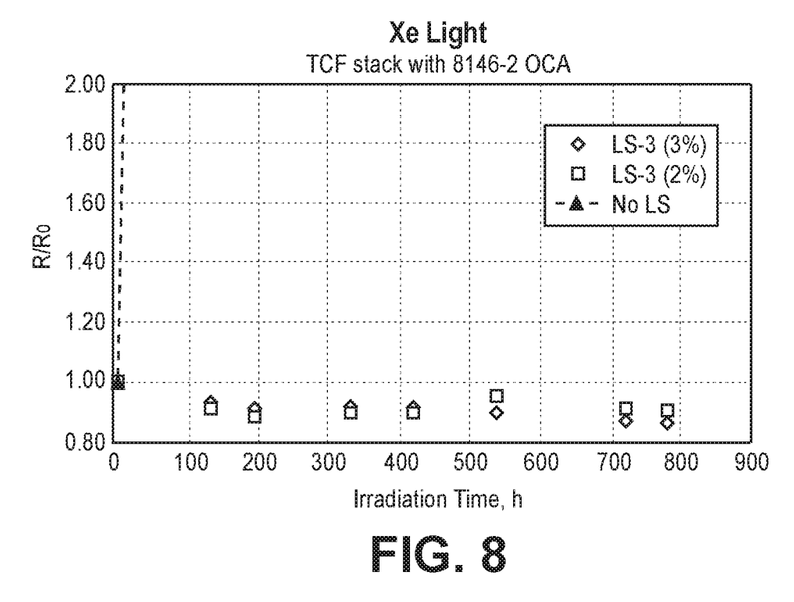
FIG. 8 is a plot of change in sheet resistance as a function of time of exposure to test conditions for a sample having an overcoat with LS-3, an optically clear adhesive and a hard coated PET cover as in Configuration B (half stack with half black tape on top).

A set of samples was prepared according to test configuration B with LS-3 stabilizer in a commercial overcoat solution OC-1. The stabilization compound was placed in the overcoat layer at a concentration of 2 and 3 wt % relative to the solids in the layer, respectively. One set of samples without LS-3 were also prepared for comparison. The results are shown in FIG. 8 for Xe light irradiation stability. The results demonstrate excellent stabilization to near 800 hrs under the test conditions and at even the lower concentration of 2 wt % relative to solids, LS-3 showed very pronounced effect of stabilization.

The vanadium (+5) stabilization compositions yield films with little changes in optical property. In comparison, other stabilizer in the art can cause higher yellowness of the film, as evaluated with the parameter b*, when incorporated in the same manor. In Table 1, the properties are compared for films with an overcoat with either LS-3 or Fe(acac)$_3$ (LSF).

Color spaces can be defined to relate spectral wavelengths to human perception of color. CIELAB is a color space determined by the International Commission on Illumination (CIE). The CIELAB color space uses a three-dimensional set of coordinates, L*, a* and b*, where L* relates to the lightness of the color, a* relates to the position of the color between red and green, and b* relates to the position of the color between yellow and blue. The "*" values represent normalized values relative to a standard white point. The CIELAB parameters can be determined using commercial software from measurements made in a spectrophotometer.

TABLE 1

| Film | Coating | OC | Sheet Resistance (Ω/□) | TT % | H % | b* |
|---|---|---|---|---|---|---|
| 1 | Control (OC-1) | Before OC | 55.0 | 91.6 | 0.90 | 1.39 |
|  |  | After OC | 58.0 | 91.5 | 0.70 | 1.45 |
| 2 | OC-1 with LS-3 | Before OC | 54.7 | 91.5 | 0.89 | 1.42 |
|  | (1.5% in solids) | After OC | 55.3 | 91.3 | 0.66 | 1.43 |
| 3 | OC-1 with LSF | Before OC | 53.0 | 91.5 | 0.92 | 1.50 |
|  | (3% in solids) | After OC | 55.0 | 91.3 | 0.72 | 1.70 |

TABLE 1-continued

| Film | Coating | OC | Sheet Resistance (Ω/□) | TT % | H % | b* |
| --- | --- | --- | --- | --- | --- | --- |

Example 5—Stabilization Effects of Stabilizers with Different Optically Conductive Adhesives This example demonstrates that the inventive stabilization compositions offer excellent stabilization with a variety of optically clear adhesives that are used for device stack making.

Figure 9:
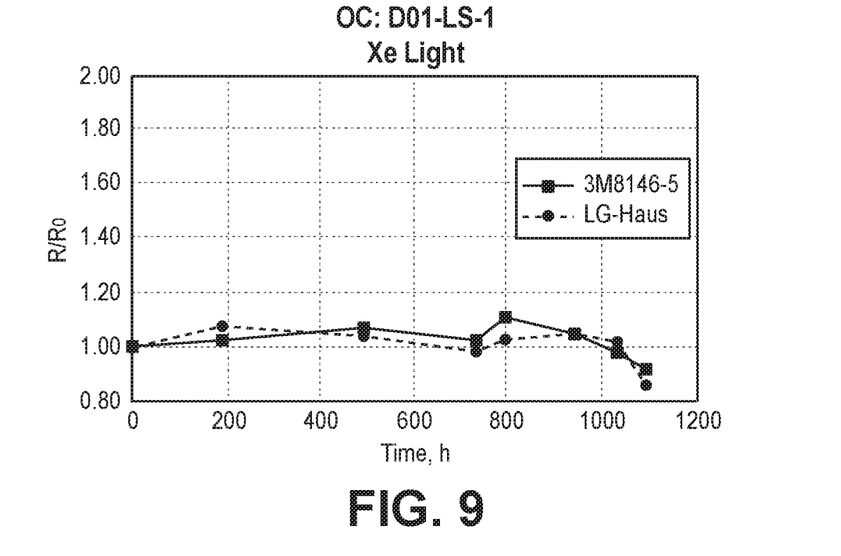
FIG. 9 is a plot of change in sheet resistance as a function of time of exposure to test conditions for a sample having LS-1 added to commercial overcoat OC-1, two optically clear adhesives from different suppliers, respectively, and a hard coated PET cover as in Configuration B (half stack with half black tape on top).

Two sets of samples were prepared according to test configuration B with two different optically clear adhesive tapes, OCA-1=3M 8146-2 and OCA-2=LG Hausys 9052D, which do not have a carrier film. The results are plotted in FIG. 9. The stabilization was similar with the two different optically clear adhesive tapes with good results obtained for both samples.

Example 6—Stabilization Effects of Stabilizers Incorporated Through Conductive Ink Formulation This example demonstrates that the stabilization compositions offer excellent stabilization when incorporated through the conductive ink formulation.

Figure 10:
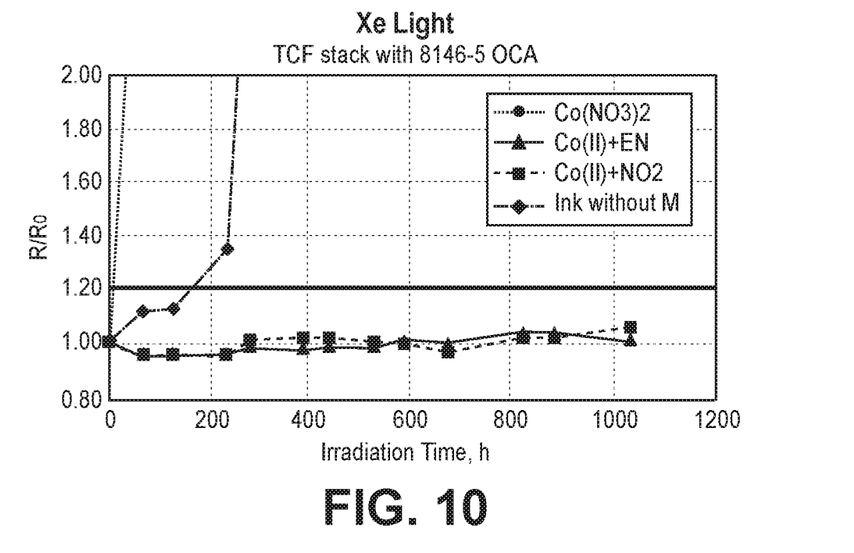
FIG. 10 is a plot of change in sheet resistance as a function of time of exposure to test conditions for a sample having metal ion complexes added to inks and no stabilizers in overcoat, an optically clear adhesive and a hard coated PET cover as in Configuration B (half stack with half black tape on top).

Four sets of samples were prepared according to test configuration B with four different inks, each containing no stabilization composition, $Co(NO_3)_2$ salt, $Co(NO_3)_2$+EN (ethylene diamine), and $Co(NO_3)_2$+$NaNO_2$, respectively, overcoated with commercial OC-1, an optically clear adhesive tapes, 3M 8146-5, and a hard coated PET cover. $Co(NO_3)_2$+EN and $Co(NO_3)_2$+$NaNO_2$ compositions were premixed from separate prepared solutions, respectively, with mole ratios of Co:EN and Co:$NO_2$ both at 1:2, respectively, before addition to ink. It was assumed that stable complexes Co(EN) and $Co(NO_2)_2$ were formed in the mixed solutions and inks, due to the strong complexing abilities of EN and $NO_2^-$. The cobalt ion to silver nanowire molar ratio in the ink was from 0.05 to 0.15. The accelerated wear testing results are shown in FIG. 10. The stabilization effect was observed when $Co(NO_3)_2$+EN and $Co(NO_3)_2$+$NaNO_2$ were combined in the inks. Stability under the test conditions of over 1000 h was achieved with these compositions, while $Co(NO_3)_2$ alone gave very poor light stability. The result indicated the $Co^{2+}$ complexes are effective light stabilizers while the simple $Co(NO_3)_2$ salt does not provide stabilizing effect to the films.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understand that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

What is claimed is:

1. A transparent conductive structure comprising a substrate, a sparse metal electrically conductive layer supported by the substrate, and a coating layer adjacent the sparse metal conductive layer, the coating layer comprising a polymer matrix and a vanadium (+5) stabilization composition, wherein the sparse metal conductive layer comprises silver, and wherein the sparse metal conductive layer comprises a fused metal nanostructured network with a sheet resistance of no more than about 100 Ohms/sq.

2. A transparent conductive structure comprising a substrate, a sparse metal electrically conductive layer supported by the substrate, and a coating layer adjacent the sparse metal conductive layer, the coating layer comprising a polymer matrix and a vanadium (+5) stabilization composition, wherein the sparse metal conductive layer comprises silver, and wherein the sparse metal conductive layer is a fused metal nanostructured network, the coating layer has an average thickness from about 40 nm to about 1.5 microns, and the vanadium (+5) stabilization composition is ammonium metavanadate ($NH_4VO_3$), tetrabutylammonium vanadate ($NBu_4VO_3$), potassium metavanadate ($KVO_3$), sodium metavanadate ($NaVO_3$), sodium orthovanadate ($Na_3VO_4$), vanadium oxytripropoxide, vanadium oxytriethoxide, vanadium oxytriisopropoxide, vanadium oxytributoxide, or mixtures thereof, the coating layer comprising from about 0.1 wt % to about 9 wt % of the vanadium (+5) stabilization composition.

* * * * *